(12) United States Patent
Jiang

(10) Patent No.: US 11,424,337 B2
(45) Date of Patent: Aug. 23, 2022

(54) ARRAY SUBSTRATE, MANUFACTURING METHOD THEREOF, AND DISPLAY PANEL

(71) Applicant: Shenzhen China STAR OPTOELECTRONICS SEMICONDUCTOR DISPLAY TECHNOLOGY CO., LTD., Guangdong (CN)

(72) Inventor: Wenjuan Jiang, Guangdong (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 266 days.

(21) Appl. No.: 16/619,017

(22) PCT Filed: Oct. 29, 2019

(86) PCT No.: PCT/CN2019/114127
§ 371 (c)(1),
(2) Date: Dec. 3, 2019

(87) PCT Pub. No.: WO2021/035931
PCT Pub. Date: Mar. 4, 2021

(65) Prior Publication Data
US 2021/0367052 A1 Nov. 25, 2021

(30) Foreign Application Priority Data
Aug. 26, 2019 (CN) .......................... 201910788113.5

(51) Int. Cl.
*H01L 29/423* (2006.01)
*H01L 27/12* (2006.01)
(Continued)

(52) U.S. Cl.
CPC .... *H01L 29/42384* (2013.01); *H01L 27/1288* (2013.01); *H01L 29/401* (2013.01);
(Continued)

(58) Field of Classification Search
CPC .......... H01L 29/42384; H01L 27/1288; H01L 29/401; H01L 29/41733; H01L 27/1248;
(Continued)

(56) References Cited

U.S. PATENT DOCUMENTS 6,395,586 B1 * 5/2002 Huang ................ H01L 29/4908
257/E21.414
9,711,602 B2 * 7/2017 Li .......................... H01L 27/124
(Continued)

FOREIGN PATENT DOCUMENTS

CN 103700706 A 4/2014
CN 103922321 A 7/2014
(Continued)

*Primary Examiner* — Shahed Ahmed
*Assistant Examiner* — Khatib A Rahman

(57) ABSTRACT

The present invention provides an array substrate, a manufacturing method thereof, and a display panel. The array substrate includes a substrate, a buffer layer, an active layer, a gate insulating layer, a gate layer, an interlayer dielectric layer, a source drain layer, and a planarization layer. The gate insulating layer is formed on the active layer and the buffer layer. The interlayer dielectric layer is formed on the gate layer and the gate insulating layer. The source drain layer is patterned to form a source and a drain, and is connected to the active layer through via holes. The planarization layer in the present invention is easier to fill in.

6 Claims, 13 Drawing Sheets

(51) Int. Cl.
   *H01L 29/40* (2006.01)
   *H01L 29/417* (2006.01)
   *H01L 29/45* (2006.01)
(52) U.S. Cl.
   CPC .... *H01L 29/41733* (2013.01); *H01L 27/1248* (2013.01); *H01L 29/45* (2013.01)
(58) Field of Classification Search
   CPC ............... H01L 29/45; H01L 29/66742; H01L 29/7869; H01L 29/66969
   See application file for complete search history.

(56) References Cited

U.S. PATENT DOCUMENTS

| | | | | |
|---|---|---|---|---|
| 2006/0001092 | A1* | 1/2006 | Kim | ............ H01L 29/458 257/E29.147 |
| 2011/0084268 | A1* | 4/2011 | Yamazaki | ......... H01L 29/66969 438/151 |
| 2014/0027762 | A1* | 1/2014 | Tsurume | ............ H01L 29/24 257/43 |
| 2015/0270406 | A1 | 9/2015 | Sun | |
| 2016/0027813 | A1* | 1/2016 | Xu | ............ H01L 29/78675 438/155 |
| 2016/0043212 | A1 | 2/2016 | Gao et al. | |
| 2016/0268320 | A1* | 9/2016 | Long | ............ H01L 27/124 |
| 2016/0293771 | A1 | 10/2016 | Long et al. | |
| 2016/0351643 | A1* | 12/2016 | Xie | ............ H01L 27/3265 |
| 2017/0194363 | A1* | 7/2017 | Ma | ............ H01L 27/1255 |
| 2018/0219105 | A1* | 8/2018 | Wang | ............ G02F 1/133345 |
| 2019/0333945 | A1 | 10/2019 | Liu et al. | |

FOREIGN PATENT DOCUMENTS

| | | |
|---|---|---|
| CN | 104362125 A | 2/2015 |
| CN | 108682653 A | 10/2018 |

* cited by examiner

ARRAY SUBSTRATE, MANUFACTURING METHOD THEREOF, AND DISPLAY PANEL

FIELD OF INVENTION

The present application relates to the field of display technologies, and in particular, to an array substrate, a manufacturing method of the array substrate, and a display panel.

BACKGROUND OF INVENTION

In current manufacturing processes of a metal oxide semiconductor substrate, an active layer, a gate insulating layer, a gate electrode, an interlayer dielectric layer, a source drain layer, and a planarization layer are sequentially manufactured on a substrate. Wherein, after the gate insulating layer and the gate are deposited, the gate and the gate insulating layer are etched once, and then the interlayer dielectric layer and other layers are deposited. Because the active layer is exposed after the gate insulating layer is etched, the interlayer dielectric layer is then deposited, the interlayer dielectric layer has a height difference corresponding to a portion deposited on the active layer and a portion corresponding to the gate insulating layer, and the height difference is large. A height of the active layer is less than a height on the gate. When the planarization layer is formed later, the step of filling the planarization layer is large, and the filling is not good, which affects the display effect.

Therefore, current array substrates have technical problems that planarization layers are not well filled, which need to be improved.

SUMMARY OF INVENTION

The present invention provides an array substrate, a manufacturing method of the array substrate, and a display panel to alleviate technical problems that planarization layers in current array substrates are not well filled.

In order to solve the above problems, technical solutions provided by the present invention are as follows:

The invention provides an array substrate, comprising:
a substrate;
a buffer layer formed on a side of the substrate;
an active layer formed on a side of the buffer layer away from the substrate;
a gate insulating layer formed on the active layer and the buffer layer;
a gate layer formed on a side of the gate insulating layer away from the active layer, and patterned to form a gate;
an interlayer dielectric layer formed on the gate layer and the gate insulating layer;
a source drain layer formed on a side of the interlayer dielectric layer away from the gate layer, and patterned to form a source and a drain, wherein the source and the drain are connected to the active layer through via holes, and the via holes are formed in the interlayer dielectric layer and the gate insulating layer; and
a planarization layer formed on a side of the source drain layer away from the interlayer dielectric layer.

In the array substrate of the present invention, the array substrate further comprises a metal conductor layer formed between the active layer and the gate insulating layer, wherein the metal conductor layer corresponds to a conductor area of the active layer.

In the array substrate of the present invention, the material of the metal conductor layer is at least one of aluminum or manganese.

In the array substrate of the present invention, the metal conductor layer has a thickness of 20 to 50 nm.

The invention further provides a manufacturing method of an array substrate, comprising the following steps:
providing a substrate;
forming a buffer layer and an active layer on a side of the substrate;
forming a gate insulating layer on the active layer and the buffer layer, forming a gate layer on the gate insulating layer, patterning the gate layer to form a gate, and forming an interlayer dielectric layer on the gate and the gate insulating layer;
etching the gate insulating layer and the interlayer dielectric layer to form via holes;
forming a source drain layer on a side of the interlayer dielectric layer away from the gate insulating layer, and patterning the source drain layer to form a source and a drain, wherein the source and the drain are connected to the active layer through the via holes; and
forming a planarization layer on a side of the source drain layer away from the interlayer dielectric layer.

In the manufacturing method of the array substrate of the present invention, the step of etching the gate insulating layer and the interlayer dielectric layer to form the via holes comprises: dry etching or wet etching the gate insulating layer and the interlayer dielectric layer.

In the manufacturing method of the array substrate of the present invention, the step of manufacturing the buffer layer and the active layer on the side of the substrate comprises: forming a buffer layer, an active layer, and a metal conductor layer on a side of the substrate, wherein the metal conductor layer corresponds to a conductor area of the active layer.

In the manufacturing method of the array substrate of the present invention, the step of forming the buffer layer, the active layer, and the metal conductor layer on the side of the substrate, wherein the metal conductor layer corresponds to the conductor area of the active layer comprises:
depositing the buffer layer, the active layer, and the metal conductor layer on a side of the substrate in sequence;
forming a photoresist layer on a side of the metal conductor layer away from the active layer, and forming a photoresist pattern by a half mask process, wherein the photoresist pattern comprises a reserved area and a semi-reserved area;
etching the metal conductor layer and the active layer not covered by the photoresist pattern;
performing dry asking on the photoresist pattern in the semi-reserved area;
etching the metal conductor layer corresponding to the semi-reserved area; and
stripping the photoresist pattern, wherein the etched metal conductor layer corresponds to the conductor area of the active layer.

In the manufacturing method of the array substrate of the present invention, after the step of stripping the photoresist pattern, wherein the etched metal conductor layer corresponds to the conductor area of the active layer, the manufacturing method of the array substrate further comprises: annealing the metal conductor layer.

In the manufacturing method of the array substrate of the present invention, the step of forming the buffer layer, the active layer, and the metal conductor layer on the side of the substrate, wherein the metal conductor layer corresponds to the conductor area of the active layer comprises: depositing at least one of aluminum or manganese on the active layer to form the metal conductor layer.

In the manufacturing method of the array substrate of the present invention, the step of forming the buffer layer, the active layer, and the metal conductor layer on the side of the substrate, wherein the metal conductor layer corresponds to the conductor area of the active layer comprises: depositing the metal conductor layer on the active layer with a film thickness of 20 to 50 nm.

In the manufacturing method of the array substrate of the present invention, the step of etching the gate insulating layer and the interlayer dielectric layer to form the via holes comprises: etching the gate insulating layer by an interlayer dielectric layer self-alignment process.

In the manufacturing method of the array substrate of the present invention, the step of etching the gate insulating layer and the interlayer dielectric layer to form the via holes comprises: forming the via holes by dry etching.

In the manufacturing method of the array substrate of the present invention, the step of forming the via holes by the dry etching comprises: using a fluorine-based gas for the dry etching.

In the manufacturing method of the array substrate of the present invention, the step of etching the gate insulating layer and the interlayer dielectric layer to form the via holes comprises; forming the via hole by wet etching.

In the manufacturing method of the array substrate of the present invention, the step of forming the via hole by the wet etching comprises: using hydrofluoric acid for the wet etching.

The invention further provides a display panel comprising an array substrate, wherein the array substrate comprises:

a substrate;

buffer layer formed on a side of the substrate;

an active layer formed on a side of the buffer layer away from the substrate;

a gate insulating layer formed on the active layer and the buffer layer;

a gate layer formed on a side of the gate insulating layer away from the active layer, and patterned to form a gate;

an interlayer dielectric layer formed on the gate layer and the gate insulating layer;

a source drain layer formed on a side of the interlayer dielectric layer away from the gate layer, and patterned to form a source and a drain, wherein the source and the drain are connected to the active layer through via holes, and the via holes are formed in the interlayer dielectric layer and the gate insulating layer; and a planarization layer formed on a side of the source drain layer away from the interlayer dielectric layer.

In the display panel of the present invention, the array substrate further comprises a metal conductor layer formed between the active layer and the gate insulating layer, and the metal conductor layer corresponds to a conductor area of the active layer.

In the display panel of the present invention, the material of the metal conductor layer is at least one of aluminum or manganese.

In the display panel of the present invention, the metal conductor layer has a thickness of 20 to 50 nm.

Beneficial Effect

The beneficial effects of the invention are: The present invention provides an array substrate, a manufacturing method of the array substrate, and a display panel. The array substrate comprises a substrate, a buffer layer, an active layer, a gate insulating layer, a gate layer, an interlayer dielectric layer, a source drain layer, and a planarization layer. The buffer layer is formed on a side of the substrate. The active layer is formed on a side of the buffer layer away from the substrate. The gate insulating layer is formed on the active layer and the buffer layer. The gate layer is formed on a side of the gate insulating layer away from the active layer and is patterned to form a gate. The interlayer dielectric layer is formed on the gate layer and the gate insulating layer. The source drain layer is formed on a side of the interlayer dielectric layer away from the gate layer, and is patterned to form a source and a drain. The source and the drain are connected to the active layer through via holes, and the via holes are formed in the interlayer dielectric layer and the gate insulating layer. The planarization layer is formed on a side of the source drain layer away from the interlayer dielectric layer. By forming the gate insulating layer on the active layer and the buffer layer, that is, the gate insulating layer is disposed as a whole layer structure, height differences between everywhere of the interlayer dielectric layer and the substrate are reduced, thereby when the planarization layer is filled, step differences are reduced, and the planarization layer is easily filled, thereby improving the display effect.

DESCRIPTION OF DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DETAILED DESCRIPTION OF PREFERRED EMBODIMENTS

The following description of the various embodiments is provided with reference to the accompanying drawings. Directional terms, such as upper, lower, front, back, left, right, inner, outer, and lateral side, mentioned in the present invention are only for reference. Therefore, the directional terms are used for describing and understanding rather than limiting the present invention. In the figures, units having similar structures are used for the same reference numbers.

The present invention provides a manufacturing method of an array substrate to alleviate a technical problem that a planarization layer in a current array substrate is not well filled.

Figure 2:
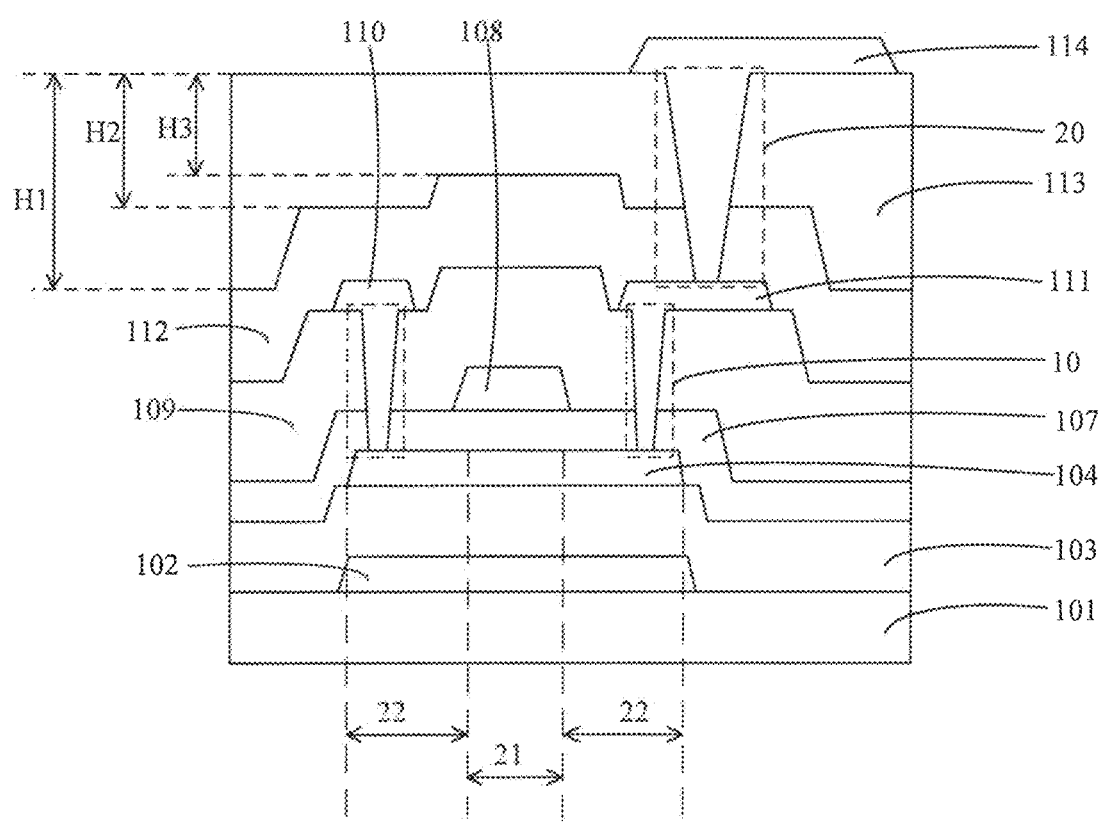
FIG. 2 is a schematic view of a first structure of an array substrate according to an embodiment of the present invention.

As shown in FIG. 2, the present invention provides an array substrate comprising a substrate 101, a buffer layer 103, an active layer 104, a gate insulating layer 107, a gate layer, an interlayer dielectric layer 109, a source drain layer, and a planarization layer 113.

The substrate 101 may be a rigid substrate or a flexible substrate. The material of the substrate 101 is not limited in the invention.

The buffer layer 103 is formed on a side of the substrate 101, and a light shielding layer 102 is further formed between the substrate 101 and the buffer layer 103.

The light shielding layer 102 is formed on a side of the substrate 101, and the material of the light shielding layer 102 may be a metal or alloy such as molybdenum, aluminum, copper, chromium, tungsten, titanium, or tantalum which can be reflective.

The buffer layer 103 is formed on a side of the light shielding layer 102 away from the substrate 101, and covers the substrate 101. The material of the buffer layer 103 may be an insulating material such as silicon oxide or silicon nitride, and the material is not specifically limited herein.

The material of the active layer 104 is a metal oxide, such as indium gallium zinc oxide (IGZO), but not limited thereto. It may also be one or more of aluminum zinc oxide (AZO), indium zinc oxide (IZO), zinc oxide (ZnO), indium oxide (In2O3), boron-doped zinc oxide (BZO), or magnesium-doped zinc oxide (MZO). In addition, the active layer 104 may also be a polysilicon material or other material.

The gate insulating layer 107 is formed on the active layer 104 and the buffer layer 103. That is, the gate insulating layer 107 is disposed at the entire layer and covers the active layer 104 and the buffer layer 103. The material of the gate insulating layer 107 may be an insulating material such as silicon oxide or silicon nitride.

The gate layer is formed on a side of the gate insulating layer 107 away from the active layer 104. The material of the gate layer may be molybdenum, aluminum, or copper, but not limited thereto. It may also be a material such as chromium, tungsten, titanium, tantalum, and an alloy containing the same, and the material is not specifically limited herein. The gate layer is patterned by an etching process to form a gate 108.

The interlayer dielectric layer 109 is formed on the gate layer and the gate insulating layer 107. That is, the interlayer dielectric layer 109 covers the gate layer and the gate insulating layer 107. The material of the interlayer dielectric layer 109 may be an insulating material such as silicon oxide or silicon nitride.

The source drain layer is formed on a side of the interlayer dielectric layer 109 away from the gate layer, and the material of the source drain layer may be molybdenum, aluminum, or copper, but not limited thereto. It may also be the material such as chromium, tungsten, titanium, tantalum, and alloys containing them. The source drain layer is patterned by an etching process to form a source 110 and a drain 111. The source 110 and the drain 111 are connected to the active layer 104 through via holes 10, and the via holes 10 are formed in the interlayer dielectric layer 109 and the gate insulating layer 107.

The planarization layer 113 is formed on a side of the source drain layer away from the interlayer dielectric layer 109, and a passivation layer 112 is further formed between the planarization layer 113 and the source drain layer.

The material of the passivation layer 112 may be an inorganic material such as silicon oxide or silicon nitride. The material of the planarization layer 113 is a photoresist, which is formed on the passivation layer 112 by coating. Etching the passivation layer 112 and the planarization layer 113 to form a first via hole 20, and then forming a pixel electrode layer by physical vapor deposition on the planarization layer 113. Forming a pixel electrode 114 by an etching process, and the pixel electrode 114 is connected to the drain 111 through the first via hole 20.

Figure 1:
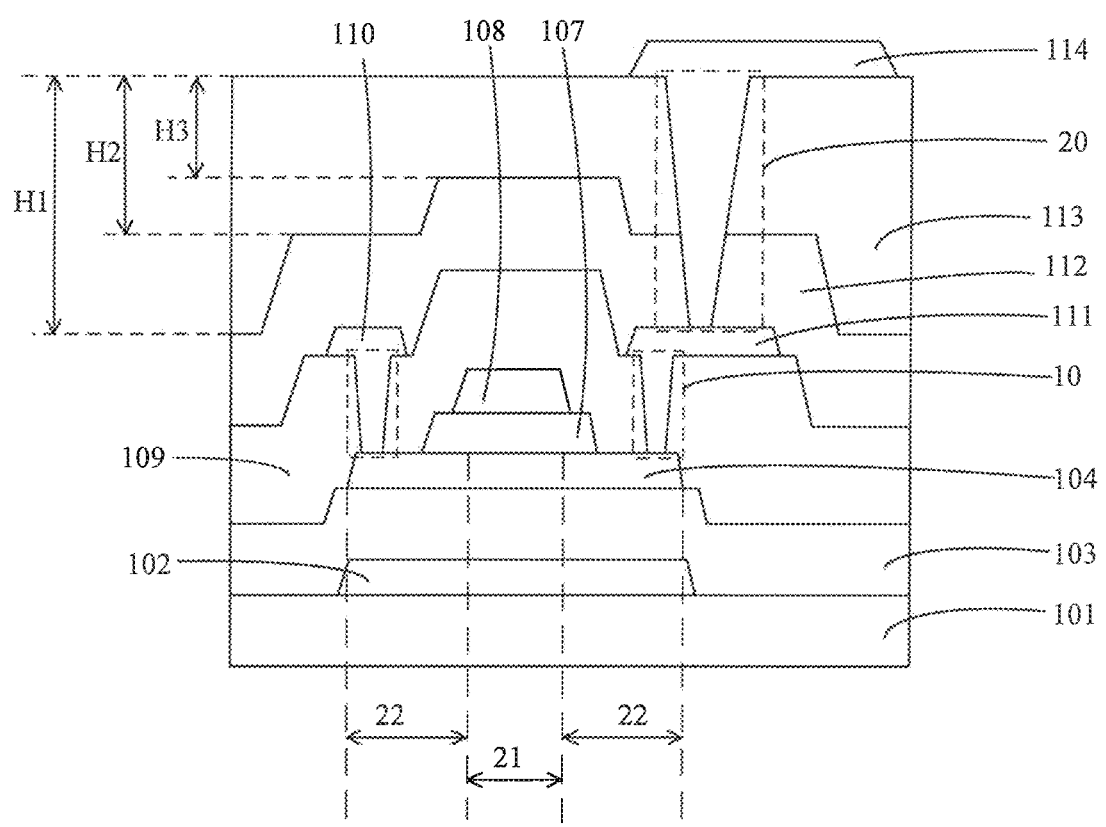
FIG. 1 is a schematic structural view of an array substrate in the prior art.

In the prior art, as shown in FIG. 1, after the gate insulating layer 107 and the gate layer are deposited in the manufacturing process of the array substrate, the gate layer is etched to form the gate electrode 108, and then the gate electrode 108 is self-aligned to etch the gate insulating layer 107. An area of the formed gate insulating layer 107 is equal to or slightly larger than an area of the gate electrode 108, and then the interlayer dielectric layer 109, the source drain layer, the passivation layer 112, and the planarization layer 113 are formed on the gate insulating layer 107.

Since when the interlayer dielectric layer 109 is formed, thicknesses of the interlayer dielectric layer 109 are equal everywhere, and the gate insulating layer 107 has an etched portion and a reserved portion. After the etched portion is removed, the interlayer dielectric layer 109 in the area is directly deposited on the active layer 104 and the buffer layer 103, and the other portion of the interlayer dielectric layer 109 is deposited on the reserved portion of the gate insulating layer 107. Finally, a height of the portion of the interlayer dielectric layer 109 correspondingly deposited over the gate insulating layer 107 is higher from the substrate 101, and a height the portion corresponding to the other film layer is lower than the substrate 101.

After the source drain layer is formed and patterned to form the source 110 and the drain 111, the passivation layer 112 is deposited. The principle is the same when the passivation layer 112 is formed. A portion of the passivation layer 112 corresponding to the deposition over the gate insulating layer 107 is the highest from the substrate 101, a portion corresponding to the source 110 and the drain 111 is higher than the substrate 101, and a portion corresponding deposited on the other film layers is the lowest from the substrate 101.

After the passivation layer 112 is completed, the planarization layer 113 needs to be deposited on the passivation layer 112. The planarization layer 113 is used to planarize the array substrate, so the planarization layer 113 needs to fill the below uneven passivation layer 112. Since the gate insulating layer 107 is etched to form another film layer, a height difference of the passivation layer 112 is large. When filling, at the highest portion of the passivation layer 112 from the substrate 101, a height of the planarization layer 113 to be filled is H3; in a portion where the passivation layer 112 is higher from the substrate 101, a height of the planarization layer 113 to be filled is H2; and in a portion where the passivation layer 112 is the lowest from the substrate 101, a height of the planarization layer 113 to be filled is H1. The difference between H1 and H3 is large, and the excessively high step will eventually cause the planarization layer 113 to have a poor filling effect, resulting in uneven pixel display and affecting the display effect.

In the present application, the gate insulating layer 107 is disposed at the entire layer, and when the interlayer dielectric layer 109 and the passivation layer 112 are formed, the gate insulating layer 107 is deposited. The height difference between the interlayer dielectric layer 109 and the substrate 101 is reduced, and the height difference between the passivation layer 112 and the substrate 101 is also reduced. When the planarization layer 113 needs to fill the passivation layer 112, the height of H1 is the same as in the prior art, while the overall thickness of the array substrate is the same, and the height of H3 is reduced relative to the prior art. That is, the passivation layer 112 is deposited corresponding to the gate insulating layer 107, the height is increased, and H1 is decreased. Finally, the difference between H1 and H3 is reduced, and the gap of the planarization layer 113 is reduced, thereby making it easier to fill and improving the display effect.

Figure 3:
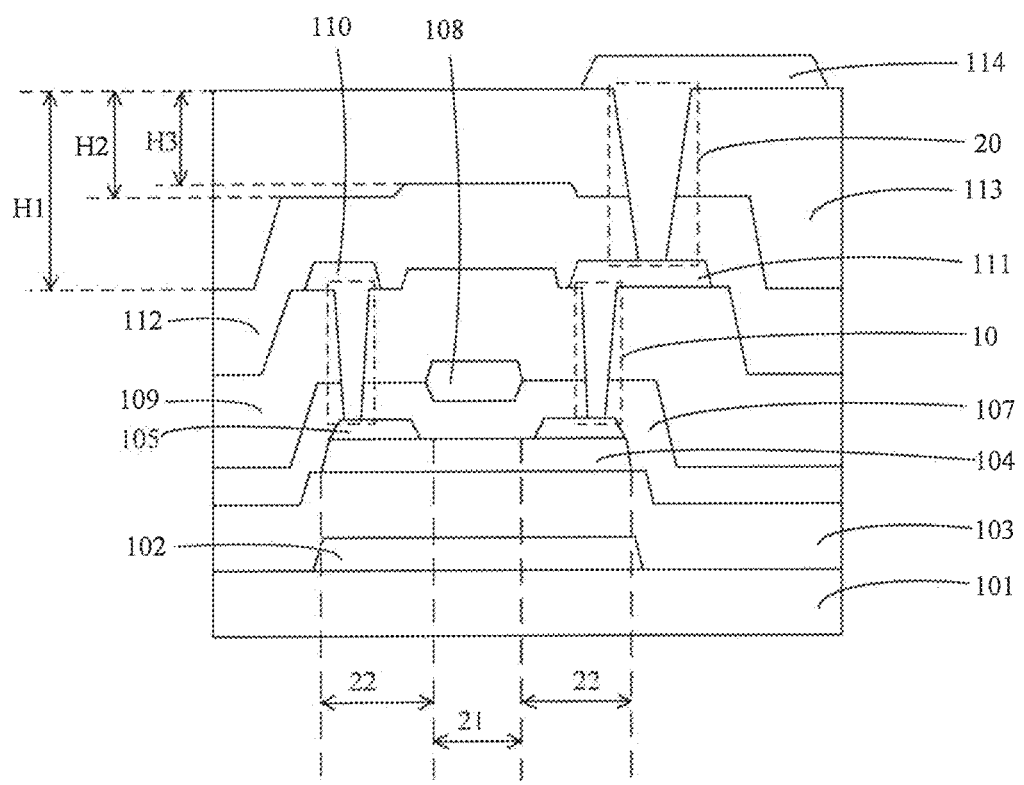
FIG. 3 is a schematic view of a second structure of the array substrate according to an embodiment of the present invention.

In an embodiment, as shown in FIG. 3, the array substrate further comprises a metal conductor layer 105. The metal conductor layer 105 is formed between the active layer 104 and the gate insulating layer 107, and the metal conductor layer 105 corresponds to a conductor area of the active layer 104.

The active layer 104 needs to be conductorized during a manufacturing process of the array substrate. There are many ways to conduct conductors, such as ion doping and adding a conductor layer on the active layer. In the present embodiment, the active layer 104 is conductorized by providing the metal conductor layer 105 on the active layer 104. That is, the metal conductor layer 105 corresponds to the conductor area of the active layer 104, and then the source 110 and the drain 111 are connected to the metal conductor layer 105 through the via holes 10. The material of the metal conductor layer 105 may be at least one of aluminum or manganese, and the metal conductor layer 105 has a thickness of 20 to 50 nm.

As shown in FIG. 3, when the metal conductor layer 105 is used for conducting the active layer 104, the ion doping technique is used. A height of the interlayer dielectric layer 109 and the passivation layer 112 deposited over the conductor area of the active layer 104 from the substrate 101 is increased relative to a height of the corresponding position in FIG. 2, and thus when the final planarization layer 113 is filled, the height of H2 in FIG. 3 is reduced relative to the height of H2 in FIG. 2, which further improves the flatness of the planarization layer 113 to some extent, and improves the display effect.

Figure 4:
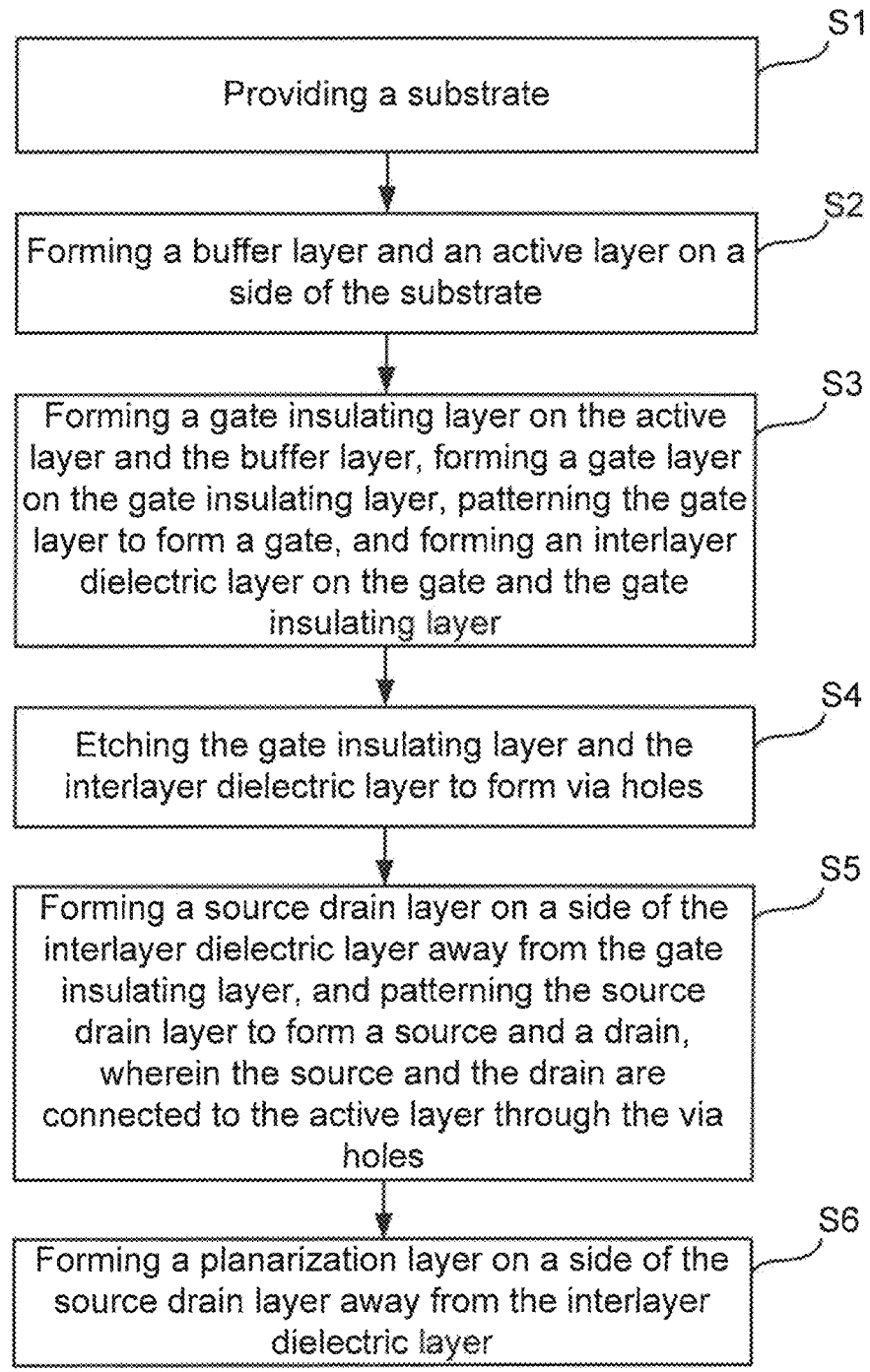
FIG. 4 is a schematic flow chart of a manufacturing method of the array substrate according to an embodiment of the present invention.

As shown in FIG. 4, the present invention further provides a manufacturing method of the array substrate, and the specific steps comprise:

S1: providing a substrate;
S2: forming a buffer layer and an active layer on a side of the substrate;
S3: forming a gate insulating layer on the active layer and the buffer layer, forming a gate layer on the gate insulating layer, patterning the gate layer to form a gate, and forming an interlayer dielectric layer on the gate and the gate insulating layer;
S4: etching the gate insulating layer and the interlayer dielectric layer to form via holes;
S5: forming a source drain layer on a side of the interlayer dielectric layer away from the gate insulating layer, and patterning the source drain layer to form a source and a drain, wherein the source and the drain are connected to the active layer through the via holes; and
S6: forming a planarization layer on a side of the source drain layer away from the interlayer dielectric layer.

The manufacturing method will be specifically described below with reference to FIG. 1 to FIG. 13.

Figure 5:
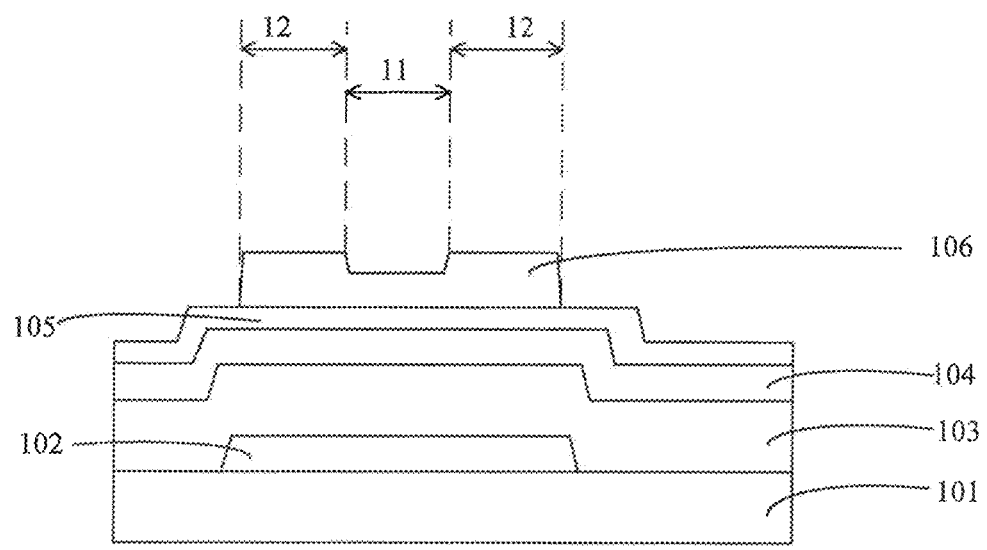
FIG. 5 is a schematic view of a first stage of the manufacturing method of the array substrate according to an embodiment of the present invention.

In S1, a substrate 101 is provided. As shown in FIG. 5, the substrate 101 may be a rigid substrate or a flexible substrate.

In S2, a buffer layer 103 and an active layer 104 are formed on a side of the substrate 101.

As shown in FIG. 5, a light shielding layer 102 is further formed between the substrate 101 and the buffer layer 103.

The light shielding layer 102 is formed on a side of the substrate 101, and the material of the light shielding layer 102 may be a metal or alloy such as molybdenum, aluminum, copper, chromium, tungsten, titanium or tantalum which can be reflective. A light shielding material layer may be formed on a surface of the substrate 101 by a process such as physical vapor sputtering or chemical vapor deposition, and then the light shielding material layer is patterned to obtain the light shielding layer 102. The light shielding layer 102 covers a portion of the substrate 101. The patterning process can be either wet or dry etching. Of course, the light shielding layer 102 can also be formed by printing or the like.

The buffer layer 103 is formed on a side of the light shielding layer 102 away from the substrate 101 and covers the substrate 101.

The active layer 104 is formed on the buffer layer 103. After the active layer 104 is formed, it is also required to be conductorized. There are various methods for conducting the active layer 104, such as ion doping or setting a metal conductor layer. In the present embodiment, the active layer 104 is conductorized by providing the metal conductor layer 105 on the active layer 104.

The step of forming the buffer layer 103, the active layer 104 and the metal conductor layer 105 on the substrate 101 specifically comprises:

S21: forming the buffer layer 103, the active layer 104, and the metal conductor layer 105 on a side of the substrate 101 in sequence.

The material of the buffer layer 103 may be an insulating material such as silicon oxide or silicon nitride, and the material is not specifically limited herein. The buffer layer 103 can be formed by chemical vapor deposition.

The material of the active layer 104 is a metal oxide, such as indium gallium zinc oxide (IGZO), but not limited thereto. It may also be one or more of aluminum zinc oxide (AZO), indium zinc oxide (IZO), zinc oxide (ZnO), indium oxide (In2O3), boron-doped zinc oxide (BZO), or magnesium-doped zinc oxide (MZO). In addition, the active layer 104 may also be a polysilicon material or other material. The active layer 104 can be formed by chemical vapor deposition, physical vapor deposition, or other processes. In this step, the active layer 104 is disposed at the entire layer.

The metal conductor layer 105 is formed on a side of the active layer 104 away from the buffer layer 103. The material of the metal conductor layer 105 may be aluminum or manganese. The metal conductor layer 105 may have a film thickness of 20 to 50 nm, and may be formed by physical vapor deposition. In this step, the metal conductor layer 105 is also disposed at the entire layer.

S22: forming a photoresist layer on a side of the metal conductor layer 105 away from the active layer 104, and patterning the photoresist pattern 106 by a half mask process. The photoresist pattern 106 comprises a reserved area 12 and a semi-reserved area 11.

Figure 6:
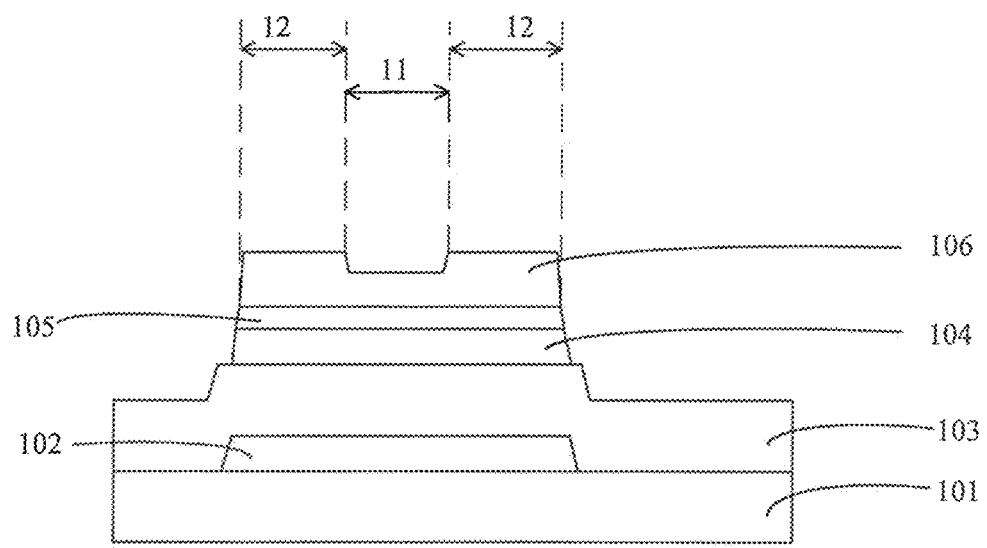
FIG. 6 is a schematic view of a second stage of the manufacturing method of the array substrate according to an embodiment of the present invention.

As shown in FIG. 5 and FIG. 6, the photoresist layer is first formed on the metal conductor layer 105, which can be formed by spin coating or other methods, and then the photoresist layer is exposed and patterned by a half mask. The half mask comprises a light transmitting area, a semi-transmissive area, and an opaque area. After the exposure and development, a portion of the photoresist layer corresponding to the light transmitting area is completely removed, and a remaining portion forms a photoresist pattern 106. The photoresist pattern 106 comprises the reserved area 12 and the semi-reserved area 11. The reserved area 12 corresponds to the opaque area, and the semi-reserved area 11 corresponds to the semi-reserved area. A thickness of the photoresist pattern 106 in the semi-reserved area 11 is smaller than a thickness in the reserved area 12.

S23: etching the metal conductor layer 105 and the active layer 104 not covered by the photoresist pattern 106. The etching result is as shown in FIG. 6, and a wet etching method may be adopted. After the etching, the metal conductor layer 105 and the active layer 104 are left with the portion covered by the photoresist pattern 106.

Figure 7:
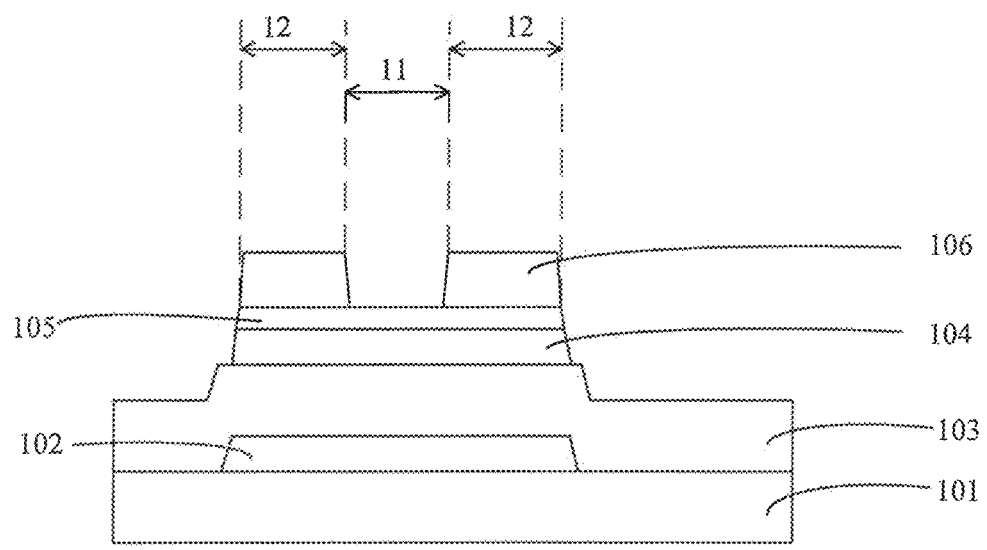
FIG. 7 is a schematic view of a third stage of the manufacturing method of the array substrate according to an embodiment of the present invention.

S24: performing dry ashing on the photoresist pattern 106 in the semi-reserved area 11. As shown in FIG. 7, after the photoresist pattern 106 in the semi-reserved area 11 is ashed, the photoresist pattern 106 in the semi-reserved area 11 is removed, and only the photoresist pattern 106 in the reserved area 12 is left.

Figure 8:
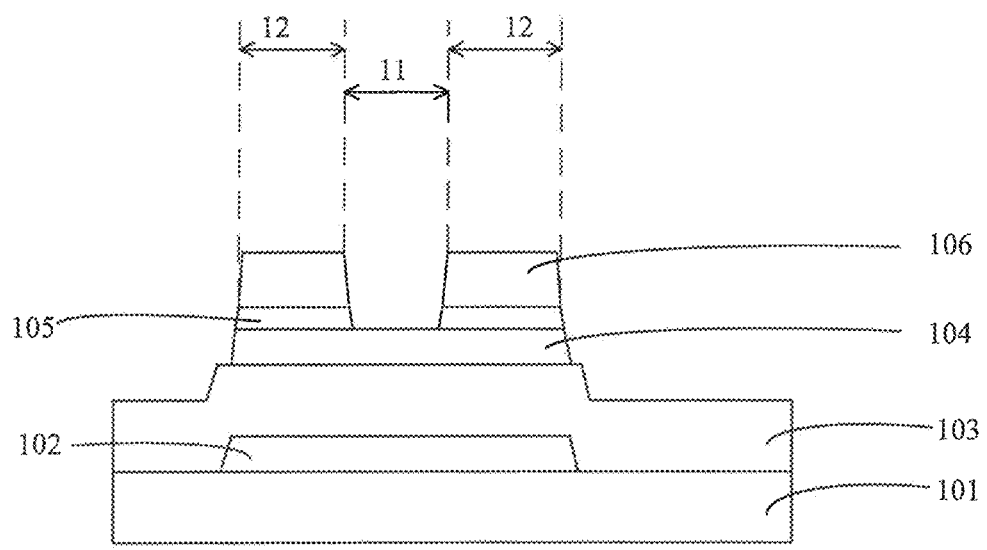
FIG. 8 is a schematic view of a fourth stage of the manufacturing method of the array substrate according to an embodiment of the present invention.

S25: etching the metal conductor layer 105 corresponding to the semi-reserved area 11. As shown in FIG. 8, the metal conductor layer 105 is etched a second time, and the etching may be performed by wet etching. After the etching is completed, the remaining metal conductor layer 105 only includes the portion corresponding to the reserved area 12.

Figure 9:
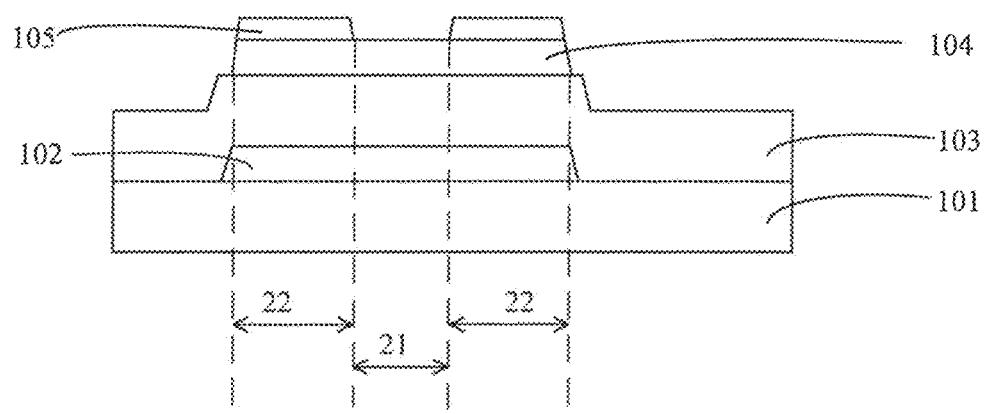
FIG. 9 is a schematic view of a fifth stage of the manufacturing method of the array substrate according to an embodiment of the present invention.

S26: stripping the photoresist pattern 106 to conduct the active layer 104, and the etched metal conductor layer 105 corresponds to the conductor area of the active layer 104. As shown in FIG. 9, the photoresist pattern 106 is stripped, and the stripping may be performed by wet stripping or dry stripping. After the stripping, the patterned active layer 104 and the metal conductor layer 105 are left, and then a high temperature annealing process is performed to realize the conductorization of the active layer 104.

The active layer 104 comprises a channel area 21 and a conductor area 22, wherein the channel area 21 corresponds to the semi-reserved area 11 of the photoresist pattern 106, and the conductor area 22 corresponds to the reserved area 12 of the photoresist pattern 106. The etched metal conductor layer 105 only comprises the portion corresponding to the reserved area 12 in the photoresist pattern 106. That is, the etched metal conductor layer 105 corresponds to the conductor area of the active layer 104.

The active layer 104 and the metal conductor layer 105 are formed through the above steps S21 to S26. The present invention uses the half mask yellow light process to define the active layer 104 and the metal conductor layer 105, but is not limited thereto.

In S3, forming a gate insulating layer 107 on the active layer 104 and the buffer layer 103, forming a gate layer on the gate insulating layer 107, patterning the gate layer to form a gate 108, and forming an interlayer dielectric layer 109 on the gate 108 and the gate insulating layer 107.

Figure 10:
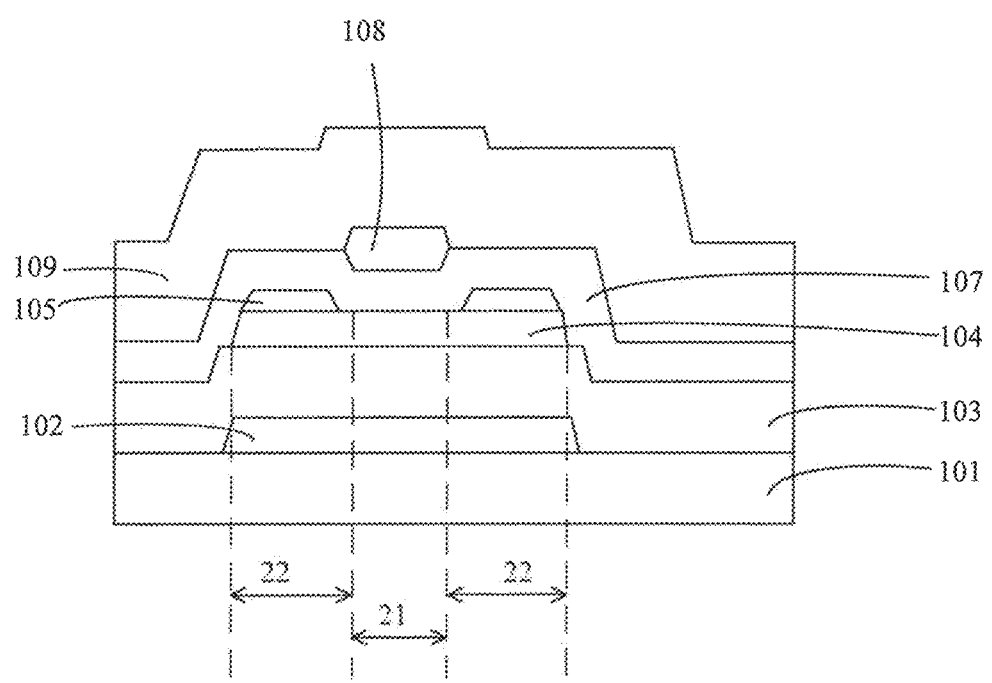
FIG. 10 is a schematic view of a sixth stage of the manufacturing method of the array substrate according to an embodiment of the present invention.

As shown in FIG. 10, the material of the gate insulating layer 107 may be an insulating material such as silicon oxide or silicon nitride, and the material is not specifically limited thereto. The gate insulating layer 107 is formed on the metal conductor layer 105 on the active layer 104 by chemical vapor deposition or other processes, and extends over the active layer 104 and the buffer layer 103. That is, the gate insulating layer 107 is formed on the active layer 104 and the buffer layer 103.

The material of the gate layer may be molybdenum, aluminum or copper, but not limited thereto, and may also be materials such as chromium, tungsten, titanium, tantalum and alloys containing the same, and the material thereof is not specifically limited thereto. The gate layer may be formed on the gate insulating layer 107 by physical vapor deposition or other processes, and patterned by the etching process to form the gate electrode 108.

The interlayer dielectric layer 109 is formed on the gate electrode 108 and extends over the gate insulating layer 107. That is, the interlayer dielectric layer 109 is formed on the gate electrode 108 and the gate insulating layer 107. The material of the interlayer dielectric layer 109 may be an insulating material such as silicon oxide or silicon nitride, and is formed by chemical vapor deposition or other processes.

In S4, etching the gate insulating layer 107 and the interlayer dielectric layer 108 to form via holes 10, and the via holes 10 correspond to the conductor area 22 of the active layer 104.

Figure 11:
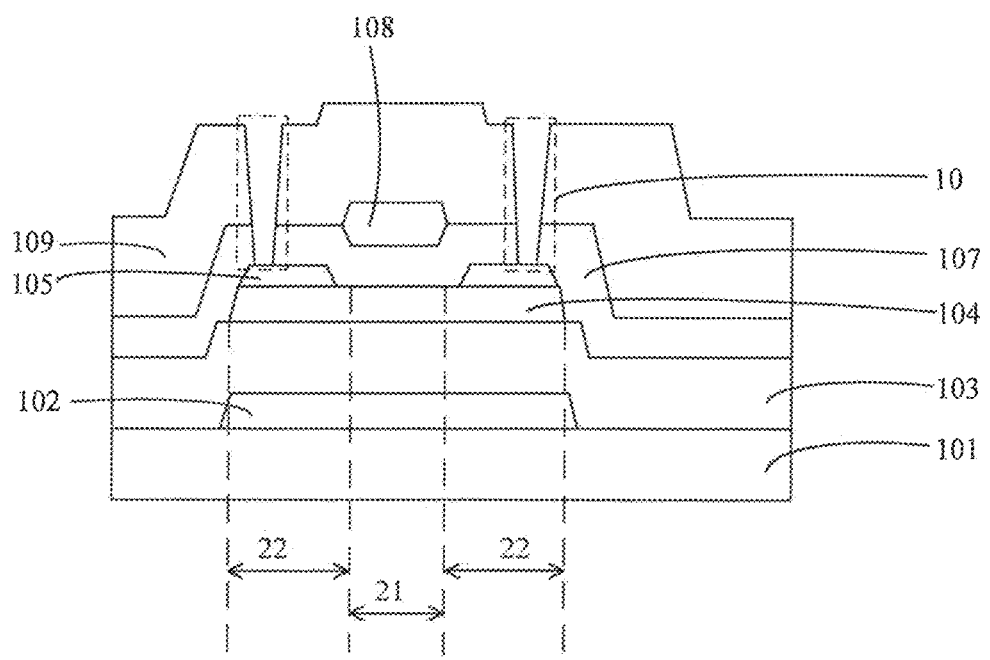
FIG. 11 is a schematic view of a seventh stage of the manufacturing method of the array substrate according to an embodiment of the present invention.

As shown in FIG. 11, the interlayer dielectric layer 108 and the gate insulating layer 107 are simultaneously etched, and an etch stop layer is the metal conductor layer 105. The metal conductor layer 105 also corresponds to the conductor area 22 of the active layer 104. That is, the via holes 10 correspond to the metal conductor layer 105. When the gate insulating layer 107 is etched, etching the gate insulating layer 107 by an interlayer dielectric layer self-alignment process.

After the wet etching is performed to form the gate electrode, the gate insulating layer 107 is not etched, but the interlayer dielectric layer 109 is deposited first. The yellow light process defines an etched area, the interlayer dielectric layer 109 and the gate insulating layer 107 are simultaneously etched, and is stopped when reaching the metal conductor layer 105. This saves an etching step and increases productivity.

In addition, since the gate insulating layer 107 is disposed at the entire layer, when the other film layers are subsequently formed, the active layer 104 is not exposed, and is protected by the gate insulating layer 107, so that the subsequent process does not affect the active layer 104.

In an embodiment, the via holes 10 can be formed by dry etching, and the gas used for dry etching is a fluorine-based gas.

In an embodiment, the via holes 10 can be formed by wet etching, and the hydrofluoric acid is used for wet etching.

In an embodiment, the via holes 10 can be formed by wet etching and dry etching, first by the wet etching with hydrofluoric acid, and then by the dry etching with fluorine gas.

S5, a source drain layer is formed on a side of the interlayer dielectric layer 109 away from the gate insulating layer 107, a source 110 and a drain 111 are patterned, and the source 110 and the drain 111 are connected to the metal conductor layer 105 through the via holes 10.

Figure 12:
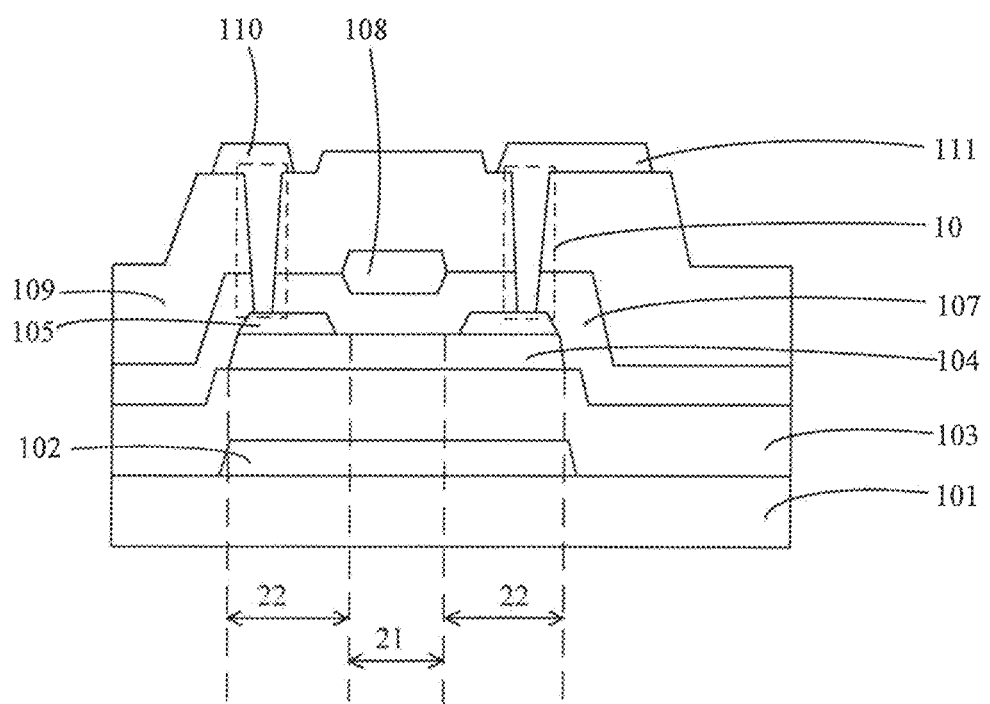
FIG. 12 is a schematic view of an eighth stage of the manufacturing method of the array substrate according to an embodiment of the present invention.

As shown in FIG. 12, the material of the source drain layer may be molybdenum, aluminum, or copper, but not limited thereto, and may also be materials such as chromium, tungsten, titanium, tantalum, and alloys containing the same. The material of the source drain layer is formed on the interlayer dielectric layer 109 by physical vapor deposition or other processes, and is patterned by an etching process to form the source 110 and the drain 111. The source 110 and the drain 111 are connected to the metal conductor layer 105 through the via holes 10.

In S6, a planarization layer 113 is formed on a side of the source drain layer away from the interlayer dielectric layer 109.

Figure 13:
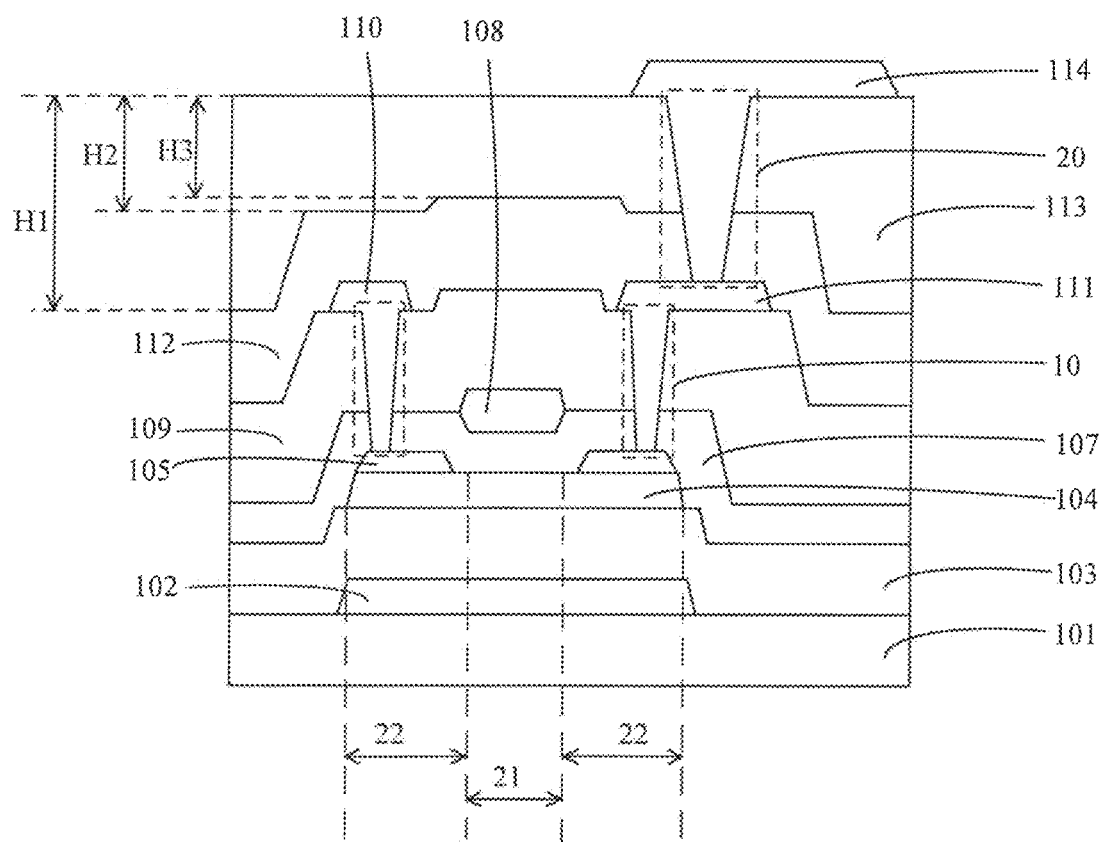
FIG. 13 is a schematic view of a ninth stage of the manufacturing method of the array substrate according to an embodiment of the present invention.

As shown in FIG. 13, a passivation layer 112 is further formed before forming the planarization layer 113. The material of the passivation layer 112 may be an inorganic material such as silicon oxide or silicon nitride, formed by chemical vapor deposition or other processes on the source drain layer. The material of the planarization layer 113 is a photoresist, which is formed on the passivation layer 112 by coating. Etching the passivation layer 112 and the planarization layer 113 to form via holes (not shown). A pixel electrode layer is formed by physical vapor deposition on the planarization layer 113, and a pixel electrode 114 is patterned by an etching process. The electrode 114 is connected to the drain 111 through a via hole.

As shown in FIG. 1, in the prior art, during a manufacturing process of the array substrate, after the gate insulating layer 107 and the gate layer are deposited, the gate layer is etched to form the gate electrode 108, and then the gate electrode 108 is self-aligned to etch the gate insulating layer 107. A formed area of the gate insulating layer 107 is equal to or slightly larger than an area of the gate electrode 108, and then the interlayer dielectric layer 109, the source drain layer, the passivation layer 112, and the planarization layer 113 are formed on the gate insulating layer 107.

Since when the interlayer dielectric layer 109 is formed, thicknesses of the interlayer dielectric layer 109 are equal everywhere, and the gate insulating layer 107 has an etched portion and a reserved portion. After the etched portion is removed, the interlayer dielectric layer 109 in the area is directly deposited on the active layer 104 and the buffer layer 103, and another portion of the interlayer dielectric layer 109 is deposited on the reserved portion of the gate insulating layer 107. Finally, a height of the portion of the interlayer dielectric layer 109 correspondingly deposited over the gate insulating layer 107 is higher from the substrate 101, and a height of the portion corresponding to the other film layers is lower than the substrate 101.

After the source drain layer is formed and patterned to form the source 110 and the drain 111, the passivation layer 112 is deposited. The principle is the same when the passivation layer 112 is formed. A portion of the passivation layer 112 corresponding to the deposition over the gate insulating layer 107 is the highest from the substrate 101, a portion corresponding to the source 110 and the drain 111 is higher than the substrate 101, and a portion corresponding deposited on the other film layers is the lowest from the substrate 101.

After the passivation layer 112 is completed, the planarization layer 113 needs to be deposited on the passivation layer 112. The planarization layer 113 is used to planarize the array substrate, so the planarization layer 113 needs to fill the below uneven passivation layer 112. Since the gate insulating layer 107 is etched to form another film layer, a height difference of the passivation layer 112 is large. When filling, at the highest portion of the passivation layer 112 from the substrate 101, a height of the planarization layer 113 to be filled is H3; in a portion where the passivation layer 112 is higher from the substrate 101, a height of the planarization layer 113 to be filled is H2; and in a portion where the passivation layer 112 is the lowest from the substrate 101, a height of the planarization layer 113 to be filled is H1. The difference between H1 and H3 is large, and the excessively high step will eventually cause the planarization layer 113 to have a poor filling effect, resulting in uneven pixel display and affecting the display effect.

In the present application, the gate insulating layer 107 is disposed at the entire layer, and when the interlayer dielectric layer 109 and the passivation layer 112 are formed, the gate insulating layer 107 is deposited. A height difference between the interlayer dielectric layer 109 and the substrate 101 is reduced, and a height difference between the passivation layer 112 and the substrate 101 is also reduced. When the planarization layer 113 needs to fill the passivation layer 112, the height of H1 is the same as in the prior art, while the overall thickness of the array substrate is the same, and the height of H3 is reduced relative to the prior art. That is, the passivation layer 112 is deposited corresponding to the gate insulating layer 107, the height is increased, and H1 is decreased. Finally, the difference between H1 and H3 is reduced, and the gap of the planarization layer 113 is reduced, thereby making it easier to fill and improving the display effect.

In addition, when the metal conductor layer 105 is used for conducting the active layer 104, the ion doping technique is used. A height of the interlayer dielectric layer 109 and the passivation layer 112 deposited over the conductor area of the active layer 104 from the substrate 101 is increased relative to a height of the corresponding position in FIG. 2, and thus when the final planarization layer 113 is filled, the height of H2 in FIG. 3 is reduced relative to the height of H2 in FIG. 2, which further improves the flatness of the planarization layer 113 to some extent, and improves the display effect.

The invention further provides a display panel comprising an array substrate, wherein the array substrate comprises:

a substrate;

a buffer layer formed on a side of the substrate;

an active layer formed on a side of the buffer layer away from the substrate;

a gate insulating layer formed on the active layer and the buffer layer;

a gate layer formed on a side of the gate insulating layer away from the active layer, and patterned to form a gate;

an interlayer dielectric layer formed on the gate layer and the gate insulating layer;

a source drain layer formed on a side of the interlayer dielectric layer away from the gate layer, and patterned to form a source and a drain, wherein the source and the drain are connected to the active layer through via holes, and the via holes are formed in the interlayer dielectric layer and the gate insulating layer; and a planarization layer formed on a side of the source drain layer away from the interlayer dielectric layer.

In an embodiment, the array substrate further comprises a metal conductor layer formed between the active layer and the gate insulating layer, and the metal conductor layer corresponds to a conductor area of the active layer.

In an embodiment, the material of the metal conductor layer is at least one of aluminum or manganese.

In an embodiment, the metal conductor layer has a thickness of 20 to 50 nm.

According to the above embodiment, it can be known:

The present invention provides an array substrate, a manufacturing method of the array substrate, and a display panel. The array substrate comprises a substrate, a buffer layer, an active layer, a gate insulating layer, a gate layer, an interlayer dielectric layer, a source drain layer, and a planarization layer. The buffer layer is formed on a side of the substrate. The active layer is formed on a side of the buffer layer away from the substrate. The gate insulating layer is formed on the active layer and the buffer layer. The gate layer is formed on a side of the gate insulating layer away from the active layer and is patterned to form a gate. The interlayer dielectric layer is formed on the gate layer and the gate insulating layer. The source drain layer is formed on a side of the interlayer dielectric layer away from the gate layer, and is patterned to form a source and a drain. The source and the drain are connected to the active layer through via holes, and the via holes are formed in the interlayer dielectric layer and the gate insulating layer. The planarization layer is formed on a side of the source drain layer away from the interlayer dielectric layer. By forming the gate insulating layer on the active layer and the buffer layer, i.e., the gate insulating layer is disposed as a whole layer structure, height differences between the interlayer dielectric layers and the substrate are reduced, thereby when the planarization layer is filled, step differences are reduced, and the planarization layer is more easily filled, thereby improving the display effect.

In the above, various other corresponding changes and modifications can be made according to the technical solutions and technical ideas of the present invention to those skilled in the art, and all such changes and modifications are within the scope of the claims of the present invention.

What is claimed is:

1. An array substrate, comprising:
   a substrate;
   a buffer layer formed on a side of the substrate;
   an active layer formed on a side of the buffer layer away from the substrate;
   a gate insulating layer formed on the active layer and the buffer layer;
   a gate layer formed on a side of the gate insulating layer away from the active layer, wherein a bottom surface of the gate layer is lower than a top surface of the gate insulating layer;
   an interlayer dielectric layer formed on the gate layer and the gate insulating layer;
   a source drain layer formed on a side of the interlayer dielectric layer away from the gate layer, wherein the source drain layer are connected to the active layer through via holes, and the via holes are formed in the interlayer dielectric layer and the gate insulating layer;
   a planarization layer formed on a side of the source drain layer away from the interlayer dielectric layer; and
   a metal conductor layer formed between the active layer and the gate insulating layer, wherein the metal conductor layer corresponds to a conductor area of the active layer.

2. The array substrate as claimed in claim 1, wherein the material of the metal conductor layer is at least one of aluminum or manganese.

3. The array substrate as claimed in claim 1, wherein the metal conductor layer has a thickness of 20 to 50 nm.

4. A display panel, comprising:
   an array substrate, wherein the array substrate comprises:
   a substrate;
   a buffer layer formed on a side of the substrate;
   an active layer formed on a side of the buffer layer away from the substrate;
   a gate insulating layer formed on the active layer and the buffer layer;
   a gate layer formed on a side of the gate insulating layer away from the active layer, wherein a bottom surface of the gate layer is lower than a top surface of the gate insulating layer;
   an interlayer dielectric layer formed on the gate layer and the gate insulating layer;
   a source drain layer formed on a side of the interlayer dielectric layer away from the gate layer, wherein the source drain layer are connected to the active layer through via holes, and the via holes are formed in the interlayer dielectric layer and the gate insulating layer;
   a planarization layer formed on a side of the source drain layer away from the interlayer dielectric layer, and
   a metal conductor layer formed between the active layer and the gate insulating layer, and the metal conductor layer corresponds to a conductor area of the active layer.

5. The display panel as claimed in claim 4, wherein the material of the metal conductor layer is at least one or aluminum and manganese.

6. The display panel as claimed in claim 4, wherein the metal conductor layer has a thickness of 20 to 50 nm.

* * * * *